United States Patent
Miyano et al.

(10) Patent No.: US 7,119,994 B2
(45) Date of Patent: Oct. 10, 2006

(54) ACTUATOR HAVING A PAIR OF ARMS WITH PIEZOELECTRIC DEVICES ATTACHED THERETO AND METHODS OF MAKING THE SAME

(75) Inventors: Masaichi Miyano, Yuri-gun (JP); Mitsunao Homma, Yuri-gun (JP)

(73) Assignee: TDK Corporation, Tokyo (JP)

( * ) Notice: Subject to any disclaimer, the term of this patent is extended or adjusted under 35 U.S.C. 154(b) by 172 days.

(21) Appl. No.: 10/720,440

(22) Filed: Nov. 25, 2003

(65) Prior Publication Data

US 2004/0150297 A1 Aug. 5, 2004

(30) Foreign Application Priority Data

Nov. 28, 2002 (JP) .............................. 2002-345815
Nov. 28, 2002 (JP) .............................. 2002-346476

(51) Int. Cl.
*G11B 5/56* (2006.01)
(52) U.S. Cl. ................................. 360/294.4; 310/311
(58) Field of Classification Search ............. 360/294.4
See application file for complete search history.

(56) References Cited

U.S. PATENT DOCUMENTS

| 5,438,231 | A | * | 8/1995 | Khoshnevisan et al. .... 310/321 |
| 5,903,380 | A | * | 5/1999 | Motamedi et al. .......... 359/224 |
| 6,078,473 | A | * | 6/2000 | Crane et al. .............. 360/294.3 |
| 6,259,548 | B1 | * | 7/2001 | Tsugai et al. ................ 359/224 |
| 6,453,744 | B1 | * | 9/2002 | Williams .................. 73/504.12 |
| 6,735,004 | B1 | * | 5/2004 | Hagelin et al. ............. 359/198 |
| 6,854,832 | B1 | * | 2/2005 | Matsuda ....................... 347/68 |
| 2003/0022412 | A1 | * | 1/2003 | Higgins et al. ................ 438/50 |
| 2003/0117041 | A1 | * | 6/2003 | Kurihara et al. .............. 310/328 |
| 2004/0145834 | A1 | * | 7/2004 | Miyano et al. .......... 360/294.4 |
| 2005/0168524 | A1 | * | 8/2005 | Xin-Shan et al. ............. 347/40 |

FOREIGN PATENT DOCUMENTS

| EP | 1 225 644 A2 | 7/2002 |
| EP | 1 306 908 A1 | 5/2003 |
| EP | 1 357 611 A1 | 10/2003 |
| JP | A 2001-320103 | 11/2001 |
| JP | A 2002-26411 | 1/2002 |
| JP | A 2002-289936 | 10/2002 |
| JP | A 2003-8093 | 1/2003 |
| WO | WO 01/97296 A1 | 12/2001 |

* cited by examiner

*Primary Examiner*—Jefferson Evans
(74) *Attorney, Agent, or Firm*—Oliff & Berridge, PLC

(57) ABSTRACT

The actuator in accordance with the present invention is provided with a pair of arms and a connecting part for connecting them to each other. The arms and connecting part are integrally formed from single-crystal silicon. Respective piezoelectric devices are attached to the arms.

5 Claims, 7 Drawing Sheets

ACTUATOR HAVING A PAIR OF ARMS WITH PIEZOELECTRIC DEVICES ATTACHED THERETO AND METHODS OF MAKING THE SAME

BACKGROUND OF THE INVENTION

1. Field of the Invention

The present invention relates to an actuator utilizing arm displacements of a silicon structure having a piezoelectric device attached thereto, and a method of making the same. In particular, the present invention relates to an actuator suitable for controlling the position of a magnetic head in a magnetic recording apparatus with high precision and so forth, and a method of making the same.

2. Related Background Art

In recent years, magnetic recording density has been improving at a very rapid rate. Therefore, the track pitch width has been narrowed so as to increase the density, which makes it necessary to improve the precision in regulating the magnetic head position with respect to track positions. However, there is a limit to the magnetic head position regulation when depending on the control of a VCM (voice coil motor) alone. Hence, a two-stage servo control system utilizing a VCM and an actuator for carrying out finer control has been proposed.

Conventionally known as an actuator for use in the two-stage servo control system are zirconia frame actuators and metal frame actuators (disclosed in Japanese Patent Application Laid-Open No. 2002-289936, for example).

A zirconia frame actuator is obtained by a method comprising the steps of forming a laminated zirconia sheet with a piezoelectric device by printing or the like, firing the resulting product, and then cutting the fired product into a device size. This actuator is advantageous in that its shock resistance is improved by the use of zirconia.

For making a metal frame actuator, a stainless sheet is initially etched or punched, so as to form a slider mount, a part to be secured to a suspension, and a pair of driving parts (arms) to which a piezoelectric device is attached. Subsequently, each driving part is bent so as to become perpendicular to the slider mount, and a piezoelectric device is attached to the outer side of each driving part. This yields an actuator having a main part integrally formed from a metal. The integral forming can reduce the number of components, while improving production efficiency.

SUMMARY OF THE INVENTION

However, the following problems have been found in the above-mentioned conventional actuators. First, the zirconia frame actuators have such a high hardness that their workability is low, whereby they are not suitable for downsizing and are hard to follow a trend to make head sliders smaller which will be expected from now on. Ceramics such as zirconia tend to contain bubbles, which also make it difficult for a pair of driving parts (arms) to be controlled with high precision.

On the other hand, bending or the like is necessary for integrally forming the metal frame actuators, which takes time and effort for making them.

It is an object of the present invention to provide an actuator which can control arms with high precision and can be made easily and smaller, and a method of making the same.

The above-mentioned object can be achieved by the present invention. Namely, the actuator in accordance with the present invention comprises a silicon structure, integrally formed from single-crystal silicon, having a pair of arms and a connecting part for connecting the arms to each other; and respective piezoelectric devices attached to the arms.

Since the actuator is formed from single-crystal silicon, crystal defects are less therein, whereby the arms can be controlled with high precision.

Since the actuator is formed from silicon, photolithography techniques used in semiconductor making processes and the like can be utilized for the making thereof. The photolithography techniques enable fine processing, whereby the actuator can be made smaller.

The actuator can be made easily, since the silicon structure can integrally be formed by utilizing the photolithography techniques. The making can also be considered easy in that no bending of the arms is necessary unlike the case where a metal frame actuator is integrally formed.

Preferably, in the actuator of the present invention, each piezoelectric device has a form extending in one direction and is attached to an outer side face of the respective arm such that a longitudinal direction of the piezoelectric device extends along a longitudinal direction of the arm.

Such a configuration can effectively transmit displacements of the piezoelectric devices to the arms, thereby making it possible to control the arms with high precision.

In the actuator of the present invention, each piezoelectric device maybe a laminated piezoelectric device. This can enhance driving amounts of the piezoelectric devices, whereby the amount of displacement of the arms can be made greater.

The silicon structure maybe doped with impurities, so as to lower the resistance. This makes it possible to energize the piezoelectric devices through the silicon structure. As a consequence, the number of electrodes of piezoelectric devices can be reduced.

The method of making an actuator in accordance with the present invention comprises the steps of etching one surface of a single-crystal silicon substrate so as to form a plurality of plate-like projections arranged in parallel on the single-crystal silicon substrate; cutting the single-crystal silicon substrate into a plurality of blocks each having a pair of plate-like projections; attaching an elongated piezoelectric device body to an outer side face of each of a pair of plate-like projections in each block; and cutting the block having the elongated piezoelectric devices attached thereto into a plurality of actuators each comprising a silicon structure integrally formed with a pair of arms and a connecting part for connecting the arms to each other, and respective piezoelectric devices attached to the arms.

Since thus obtained actuator is formed from single-crystal silicon, crystal defects are less therein, whereby the arms can be controlled with high precision.

Since an etching technique which enables fine processing is utilized for the making, the actuator can be made smaller.

Since the silicon structure is integrally formed by utilizing the etching technique, the making is easy. The making can also be considered easy in that no bending of the arms is necessary unlike the case where a metal frame actuator is integrally formed.

Since elongated piezoelectric device bodies, which are easy to handle because of their length, are attached to a block, and then the block is cut into a plurality of actuators, production efficiency is much higher than in the case where piezoelectric devices are attached to the arms of the silicon structures one by one.

DESCRIPTION OF THE PREFERRED EMBODIMENTS

In the following, preferred embodiments of the present invention will be explained in detail with reference to the accompanying drawings. Constituents identical to each other will be referred to with numerals identical to each other without repeating their overlapping explanations.

Figure 1:
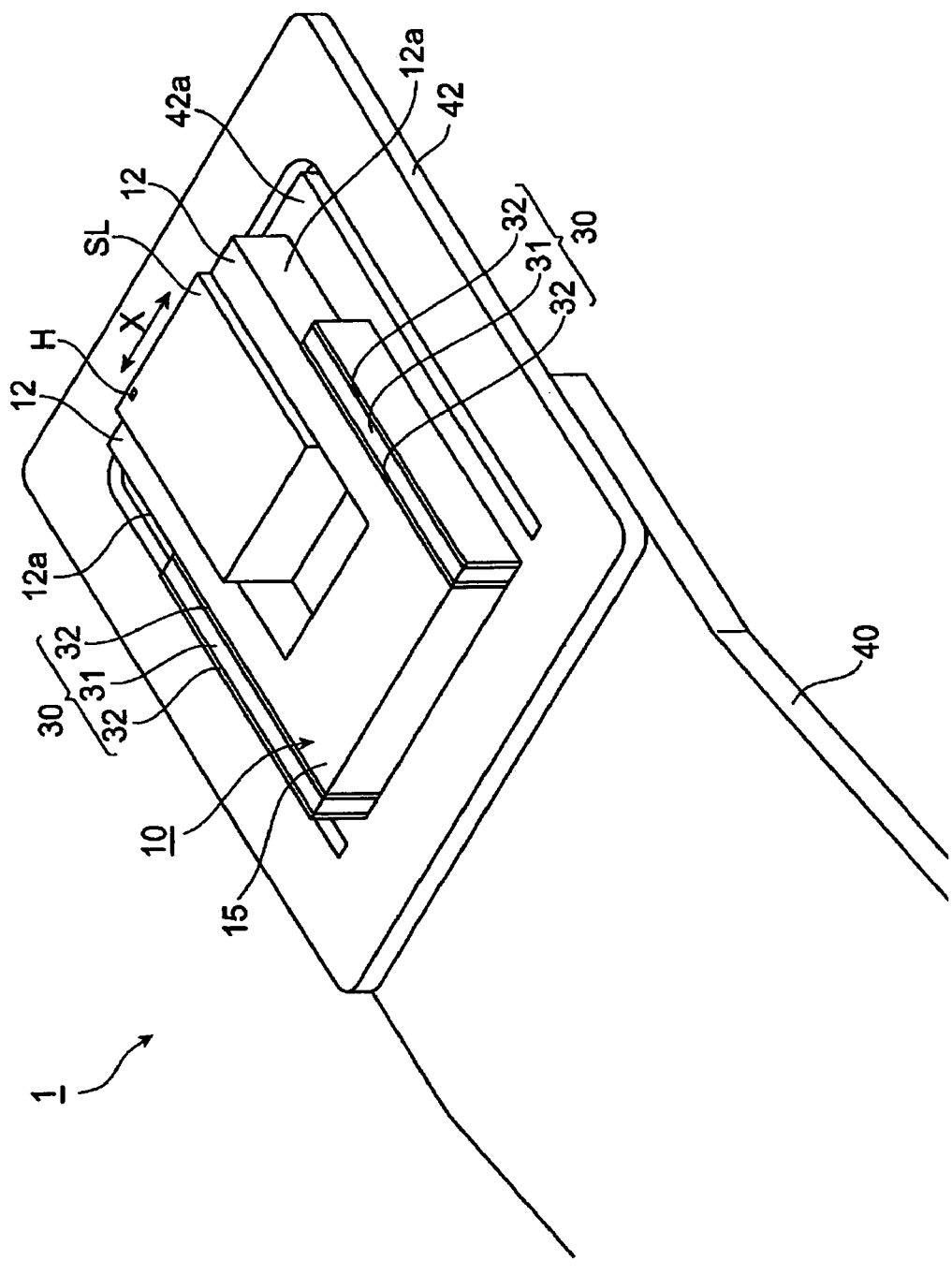
FIG. 1 is a perspective view showing the actuator in accordance with a first embodiment of the present invention.
Figure 2:
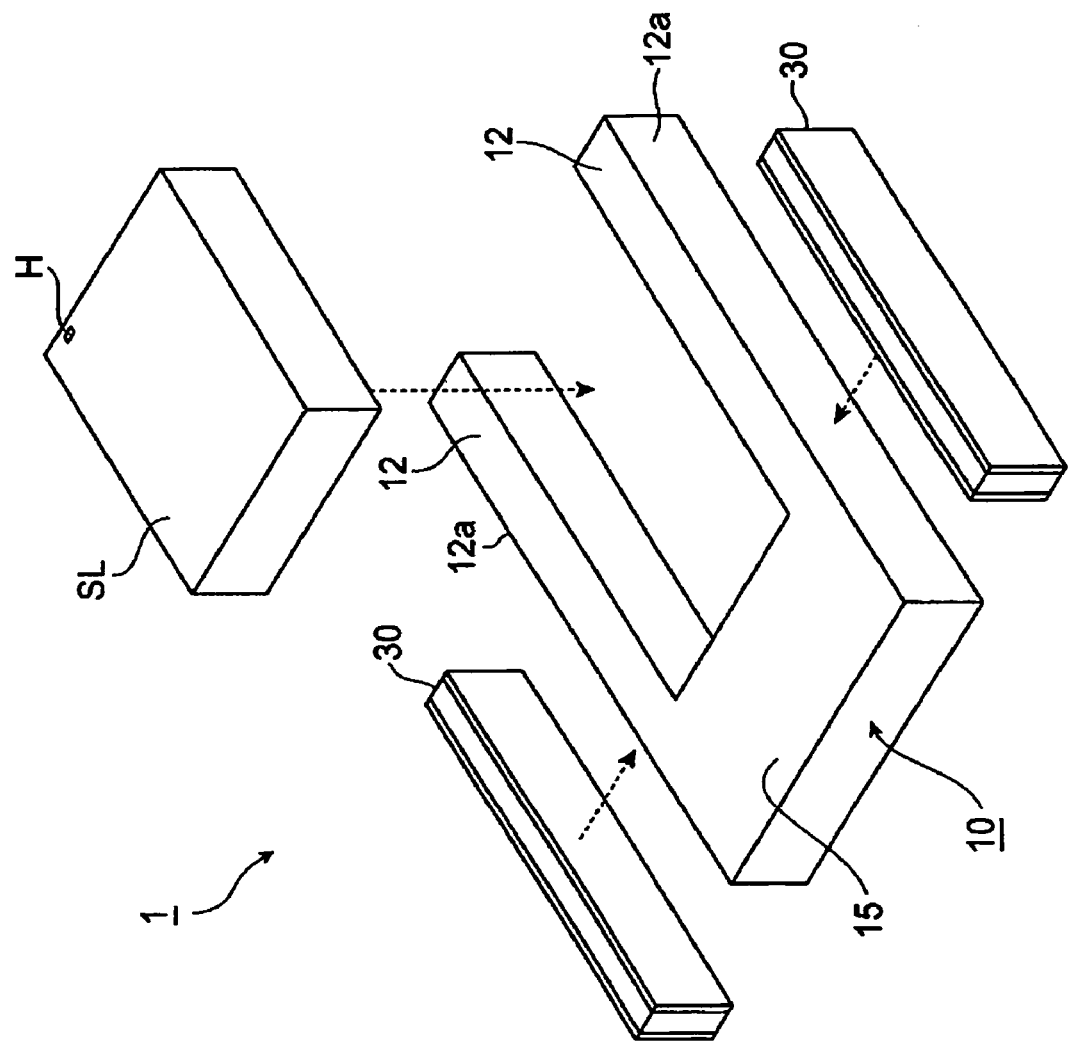
FIG. 2 is an exploded perspective view of the actuator shown in FIG. 1.

First Embodiment: FIG. 1 is a perspective view showing the actuator in accordance with a first embodiment, whereas FIG. 2 is an exploded perspective view of the actuator shown in FIG. 1. The actuator 1 in this embodiment is an actuator for HDD servo control, and is used for displacing a magnetic head slider (hereinafter referred to as "slider") SL in directions of arrows X in the drawing. The actuator 1 is constituted by a silicon structure 10 and a pair of piezoelectric devices 30, 30.

The silicon structure 10 is integrally formed into a substantially U-like shape from single-crystal silicon, and is constituted by a pair of arms 12, 12 holding the slider SL therebetween and a connecting part 15 for connecting the arms 12, 12 to each other. The connecting part 15 has a rectangular parallelepiped form with the arms 12, 12 projecting in parallel from both sides thereof. Used as the silicon structure 10 is one having a low resistance doped with impurities. The resistivity is preferably 1 Ωcm or less. The silicon structure 10 may be turned into an n-type semiconductor by doping with a donor such as phosphorus as the impurities, or into a p-type semiconductor by doping with an acceptor such as aluminum as the impurities.

Each piezoelectric device 30 is attached to the outer side face 12a of the respective arm part 12 by an electrically conductive adhesive such as those of epoxy, silicone, and acrylic types. Each piezoelectric device 30 has a single-plate structure in which front and rear faces of a piezoelectric ceramic body 31 such as PZT are formed with respective electrodes 32. Each piezoelectric device 30 extends in one direction so as to attain a rectangular plate-like form, and is attached to its corresponding arm 12 such that the longitudinal direction of the piezoelectric device 30 extends along the longitudinal direction of the arm 12. As a consequence, displacements of the piezoelectric device 30 can effectively be transmitted to the arms 12, whereby the arms 12 can be controlled with high precision.

The slider SL comprises a thin-film magnetic head H, and is used for reading magnetic recording information from hard disks and recording magnetic recording information onto hard disks. The slider SL has a substantially rectangular parallelepiped form, whose upper face in the drawing is an air-bearing surface opposing a hard disk. Here, the slider SL is depicted schematically without illustrating a slider rail for adjusting the amount of levitation from the hard disk, etc. The slider SL is secured to the inner side face of each arm 12 with an adhesive.

The actuator 1 is mounted to a suspension arm 40 of a hard disk drive. The suspension arm 40 has a leading end provided with a gimbal 42, and is driven by a voice coil motor. The actuator 1 is bonded and secured to a tongue 42a of the gimbal 42. Since the arms 12 are required to be swung, the adhesive for securing the actuator 1 to the gimbal 42 is applied to only the connecting part 15.

When a voltage is applied between the electrodes 32, 32 through the silicon structure 10 having lowered its resistance in thus configured actuator, each piezoelectric ceramic body 31 expands or contracts according to its direction of polarization. Such deformations of the piezoelectric ceramic bodies 31 can displace the arms 12, 12 in directions of arrows X (directions substantially orthogonal to the longitudinal direction of each arm 12 within the plane in which the two arms 12 are arranged), thereby controlling the position of the slider SL. Namely, the two arms 12 function as driving arms. The actuator 1 can cause the slider SL to fluctuate by a minute amount at a level which cannot be realized by the cooperation of a voice coil motor and suspension arms.

The following effects can be achieved by the actuator 1 in accordance with this embodiment. Since this actuator 1 is formed from single-crystal silicon, crystal defects are less therein, whereby the arms 12 can be controlled with high precision. Also, since single-crystal silicon does not deform plastically but elastically within the temperature range in which the hard disk drive is in use, an actuator with high controllability can be realized.

The actuator 1 is formed from silicon, and thus can be made by utilizing photolithography and micromachining techniques used in semiconductor manufacturing processes and the like. The photolithography techniques enable fine processing and thus can make the actuator 1 smaller, so that the actuator 1 can fully be used as pico-slider, femto-slider, or the like.

When producing an actuator by machining such as shaving and grinding, its surfaces may be damaged, from which cracks and the like may occur. On the other hand, dry or wet etching can prevent such a problem from occurring, whereby the actuator can fully be used as an HDD servo control actuator.

Further, the actuator can be made easily since the silicon structure 10 can integrally be formed by utilizing a photolithography technique. The making can also be considered easy in that no bending of the arms is necessary unlike the case where a metal frame actuator is integrally formed.

A method of making the actuator in accordance with this embodiment will now be explained with reference to FIGS. 3A to 3F.

Figure 3A:
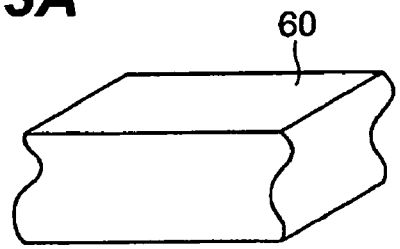
FIGS. 3A to 3F are views showing a method of making the actuator in accordance with the first embodiment.

First, as shown in FIG. 3A, a single-crystal silicon substrate 60 is prepared. The single-crystal silicon substrate 60 is intentionally undoped, thus exhibiting a high resistance.

Figure 3D:
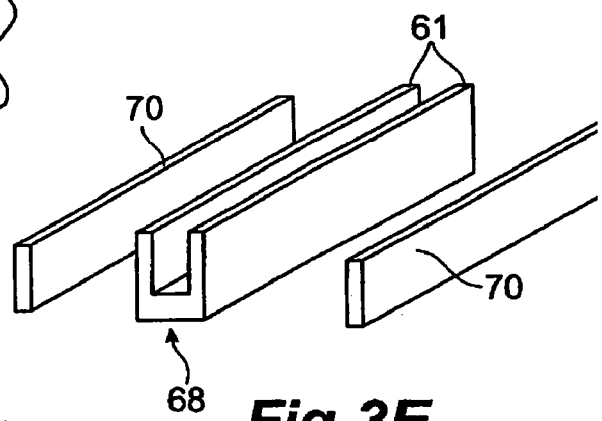
Figure 3B:
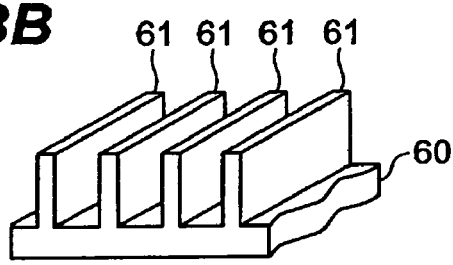

Subsequently, as shown in FIG. 3B, one surface of the single-crystal silicon substrate 60 is etched, so as to form a plurality of plate-like projections 61 arranged in parallel thereon. The plate-like projections 61, each of which is formed like a band, are parallel to each other. The plate-like projections 61 become arms 12 in a later step. The unetched region of the substrate positioned under the arms 12 becomes a connecting part 15 in a later step. The intervals of the plate-like projections 61 can be adjusted by a pattern of a photomask formed at the time of etching. The height of each plate-like projection 61 (corresponding to the length of each arm) is adjusted by the etching time.

As the above-mentioned etching, wet etching using an aqueous alkali solution such as KOH and TMAH (tetramethyl ammonium hydroxide) as an etchant or dry etching such as ICP-RIE (inductive coupling plasma reactive ion etching) using $SF_6/CF_4$ is carried out after a pattern is formed with a photoresist. Here, the surface orientation of the silicon substrate is preferably that of (110) surface when subjected to wet etching, but not restricted in particular in the case of dry etching. Though a (110)—surface-oriented substrate is used for wet etching, there is no particular restriction in the case of dry etching. The plate-like projections 61 to become the arms 12 are formed by stopping the etching in the middle. The height of the projections 61 is controlled by adjusting the etching time.

Figure 3E:
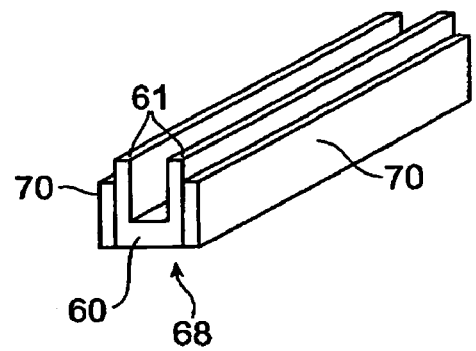
Figure 3C:
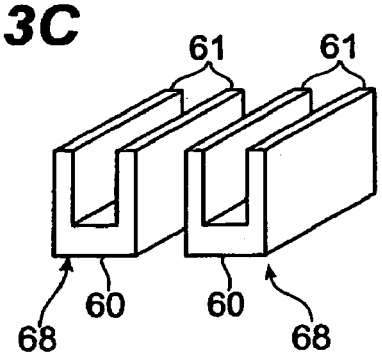

Subsequently, as shown in FIG. 3C, the etched silicon substrate having a plurality of plate-like projections 61 is cut into a plurality of blocks 68 each having a pair of plate-like projections 61. Cutting directions are parallel to the direction in which each plate-like projection 61 extends. Without being restricted in particular, the technique for cutting the substrate may employ any of dicers, slicers, wire saws, and lasers. After cutting the silicon substrate, cross sections are ground.

Next, as shown in FIG. 3D, elongated (strip-like) piezoelectric device bodies 70 are prepared. A rectangular piezoelectric ceramic body is formed with respective electrodes on its front and rear faces and then is cut thin, so as to yield the elongated piezoelectric device bodies 70.

Subsequently, as shown in FIG. 3E, the elongated piezoelectric device bodies 70 are attached to both sides of the block 68, respectively. For this attachment, an electrically conductive adhesive such as those of epoxy, silicone, and acrylic types, for example, is used. The respective elongated piezoelectric device bodies 70 attached to a pair of plate-like projections 61, 61 may be polarized in the same direction or directions opposite from each other.

Figure 3F:
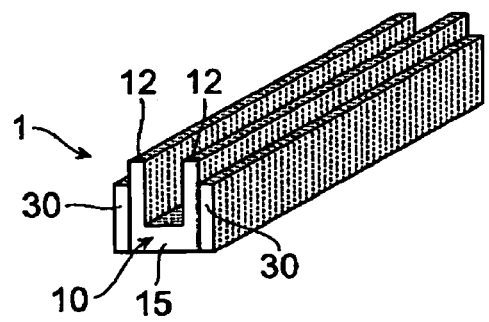

Then, as shown in FIG. 3F, the block 68 having the elongated piezoelectric device bodies 70 attached thereto is cut into a plurality of actuators 1 each having the silicon structure 10 and piezoelectric devices 30 shown in FIG. 1. Cutting directions (indicated by broken lines in FIG. 3F) are perpendicular to the direction in which each plate-like projection 61 extends. Without being restricted in particular, the technique for cutting in this case may employ any of dicers, slicers, wire saws, and lasers. The silicon structure 10 in the actuator 1 is constituted by the arms 12 yielded from the plate-like projections 61 and the connecting part 15 obtained from the remaining region of the single-crystal silicon substrate 60. The elongated piezoelectric device bodies 70 become the piezoelectric devices 30.

The foregoing is a method of making the actuator in accordance with this embodiment. Since thus obtained actuator 1 is formed from single-crystal silicon, crystal defects are less therein, whereby the arms 12 can be controlled with high precision. Also, since single-crystal silicon does not deform plastically but elastically within the temperature range in which the hard disk drive is in use, an actuator with high controllability can be realized.

Since an etching technique enabling fine processing is utilized for the making, the actuator 1 can be made smaller. Further, since the silicon structure 10 is integrally formed by utilizing the etching technique, the making is easy. The making can also be considered easy in that no bending of the arms is necessary unlike the case where a metal frame actuator is integrally formed.

Since the etching technique is used, there are less damages to silicon surfaces, whereby the actuator does not lower its strength. Since etching is used, a structure with a high aspect ratio can be formed, which makes it possible to set the length of the arms 12 over a wide range and enables productions with favorable repetitive reproducibility.

Since the elongated piezoelectric device bodies 70, which are easy to handle because of their length, are attached to the block 68, and then the block 68 is cut into a plurality of actuators 1, production efficiency is much higher than in the case where piezoelectric devices 30 are attached to the arms 12 of the silicon structures 10 one by one. Hence, the method in accordance with this embodiment is excellent in massproductivity. Specifically, the method reduces the number of operations for adjusting the positions of piezoelectric devices, and the number of bonding operations and the cost thereof. Since the elongated piezoelectric device bodies 70 can be attached to sufficiently appropriate positions with a jig alone, the method is also advantageous in that no expensive device mounting apparatus are necessary.

Figure 4:
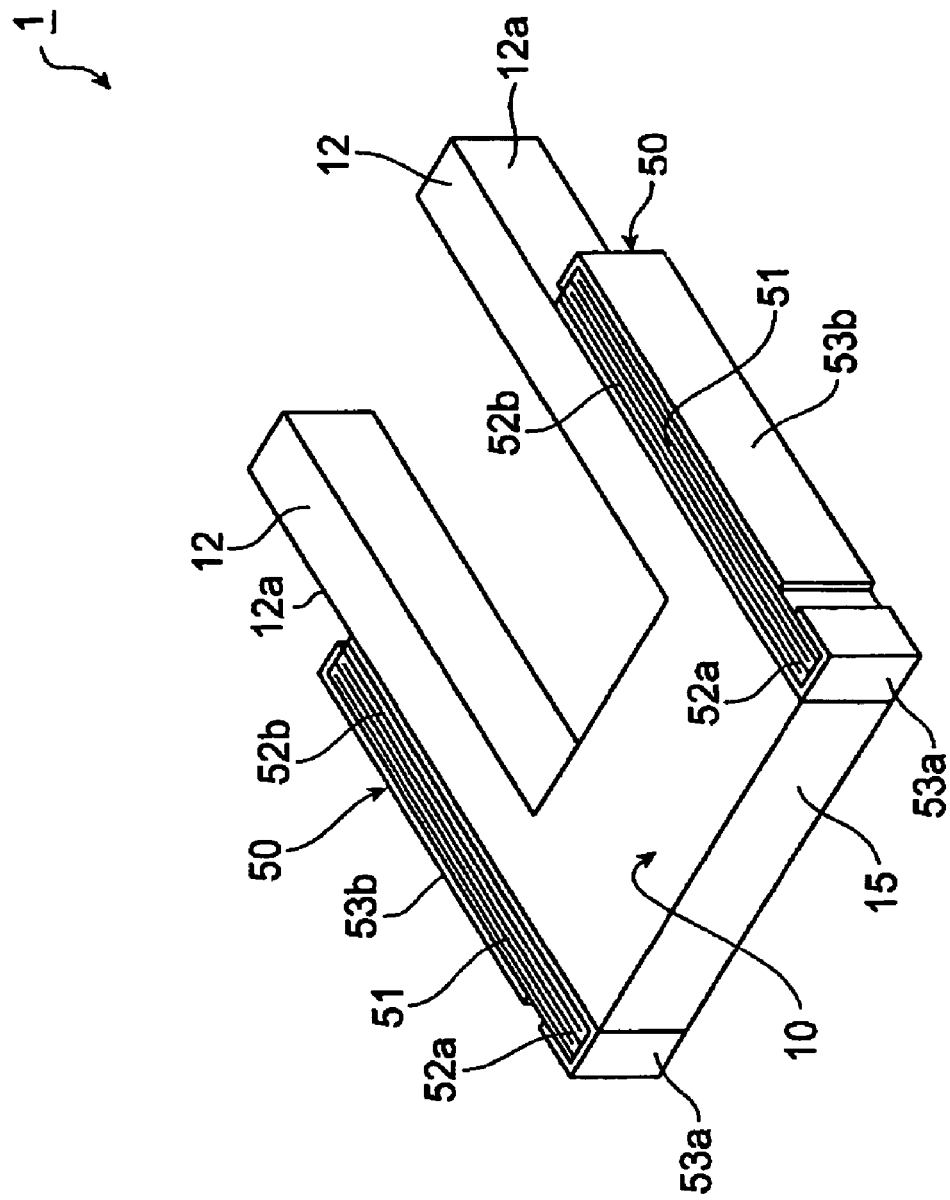
FIG. 4 is a perspective view showing the actuator in accordance with a second embodiment of the present invention.

Second Embodiment: FIG. 4 is a perspective view showing the actuator in accordance with a second embodiment of the present invention. The actuator 1 in accordance with the second embodiment differs from that of the first embodiment in that a laminated piezoelectric device 50 is used in place of the single-plate one. Within a piezoelectric ceramic body 51 of each laminated piezoelectric device 50, inner electrodes 52a, 52b are alternately laminated. End parts of the inner electrodes 52a are exposed at one end face of the piezoelectric ceramic body 51 and are connected to an outer electrode 53a. On the other hand, end parts of the inner electrodes 52b are exposed at the other end face of the piezoelectric ceramic body 51 and are connected to an outer electrode 53b.

The outer electrodes 53a, 53b extend from respective end face regions of the piezoelectric ceramic body 51 to their corresponding outer side faces (surfaces opposite from the sides where the arms 12 are positioned), whereby wiring operations such as wire bonding can be carried out on the same surface. Here, the outer electrode 53a covers the surface on the silicon structure 10 side in the piezoelectric ceramic body 51. The outer electrodes 53a and 53b are not in contact with each other and form a gap therebetween.

As a driving piezoelectric device, a laminated one is used in this embodiment, whereby the amount of displacement can be enhanced on the leading end side of each arm 12.

The actuator can be produced in a procedure similar to that in the first embodiment if, as strip-like elongated piezoelectric device bodies, those comprising a plurality of inner and outer electrodes as mentioned above are used at the time of making.

In this embodiment, the silicon structure 10 may be caused to attain a low resistance by doping with impurities, or a high resistance without doping. This embodiment is advantageous in that the making is easier than in the first embodiment, since the time and effort of doping with impurities can be saved.

Figure 5:
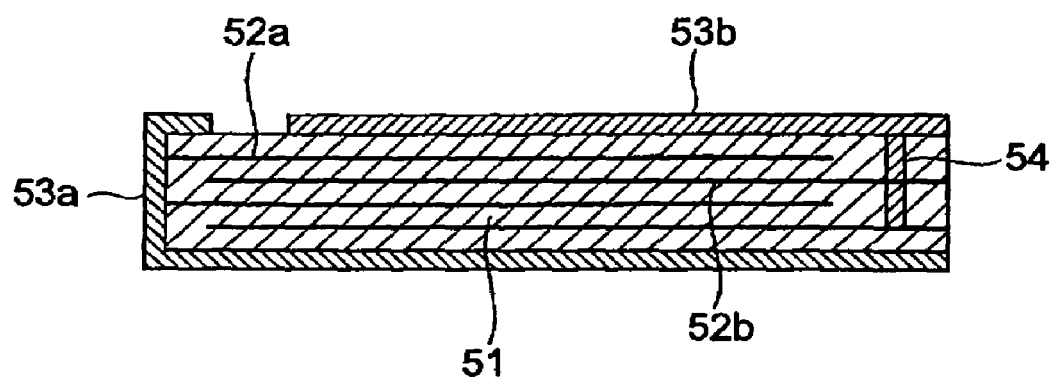
FIG. 5 is a perspective view showing a modified example of piezoelectric devices used in the actuator in accordance with the second embodiment.

FIG. 5 is a perspective view showing a modified example of piezoelectric devices used in the actuator of this embodiment. In this modified example, though the outer electrode 53a of the piezoelectric device 50 has the structure shown in FIG. 4, the other outer electrode 53b covers no end faces of the piezoelectric ceramic body 51. A through hole 54 electrically connected to the individual inner electrodes 52b is formed within the piezoelectric ceramic body 51, and is connected to the outer electrode 53b. Such a configuration can also displace the piezoelectric devices when a voltage is applied between the outer electrodes 53a, 53b.

Figure 6:
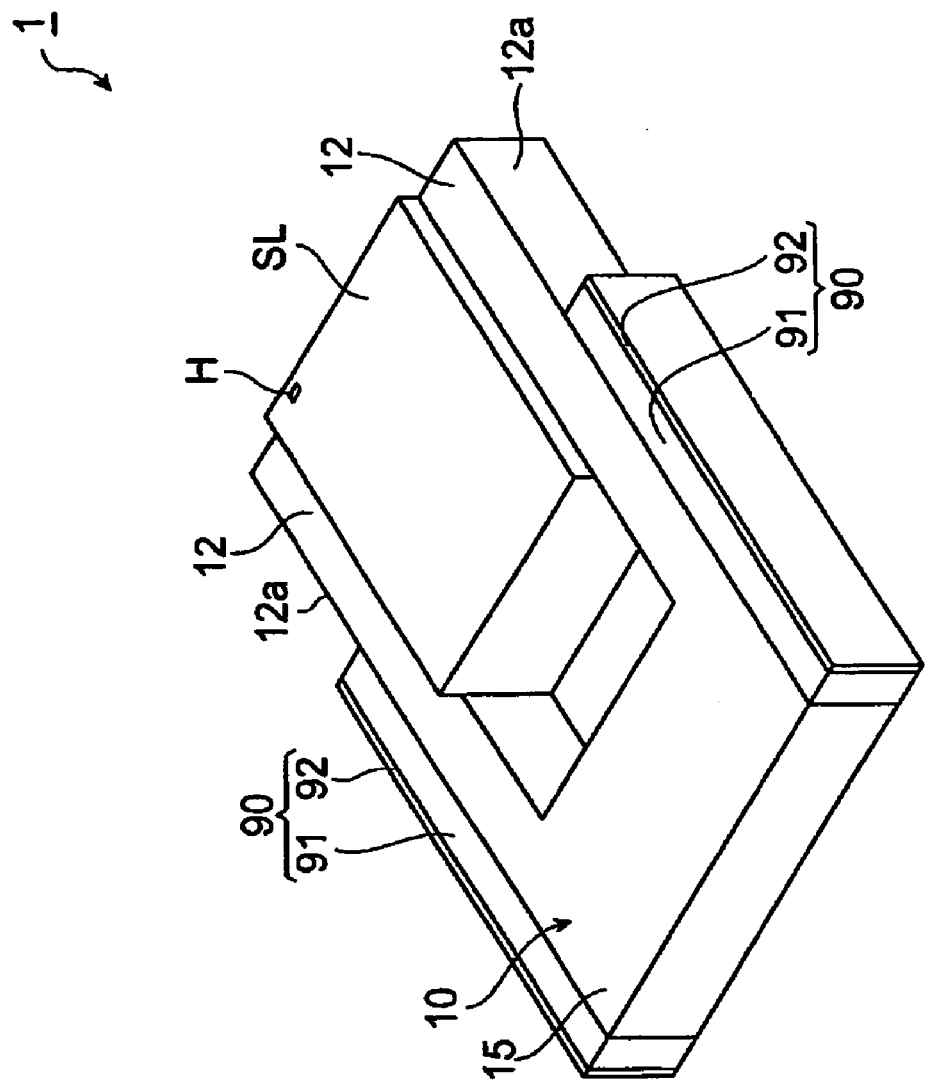
FIG. 6 is a perspective view showing the actuator in accordance with a third embodiment of the present invention.

Third Embodiment: FIG. 6 is a perspective view showing the actuator in accordance with a third embodiment of the present invention. In this embodiment, the silicon structure 10 is one in which single-crystal silicon is doped with impurities so as to lower its resistance. The resistivity is preferably 1 Ωcm or less. The silicon structure 10 may be turned into an n-type semiconductor by doping with a donor such as phosphorus as the impurities, or into a p-type semiconductor by doping with an acceptor such as aluminum as the impurities.

Each piezoelectric device 90 used in this embodiment is of a single-plate type as in the first embodiment, but is constituted by a piezoelectric ceramic body 91 and a single electrode 92 positioned on an outer side face thereof. Namely, unlike the first embodiment, an electrode is formed on only one side of the piezoelectric ceramic body 91. The piezoelectric device 90 is bonded to an arm 12 of the silicon structure 10 with an electrically conductive adhesive.

When a current is caused to run between any electrode 92 and the silicon structure 10, a voltage can be applied to any of a pair of piezoelectric devices 90, 90. Namely, the silicon structure 10 also functions as a common terminal for the piezoelectric devices 90, 90. Since only one surface of each piezoelectric device 90 is required to be formed with an electrode, the manufacturing time and cost can be cut down.

Figure 7:
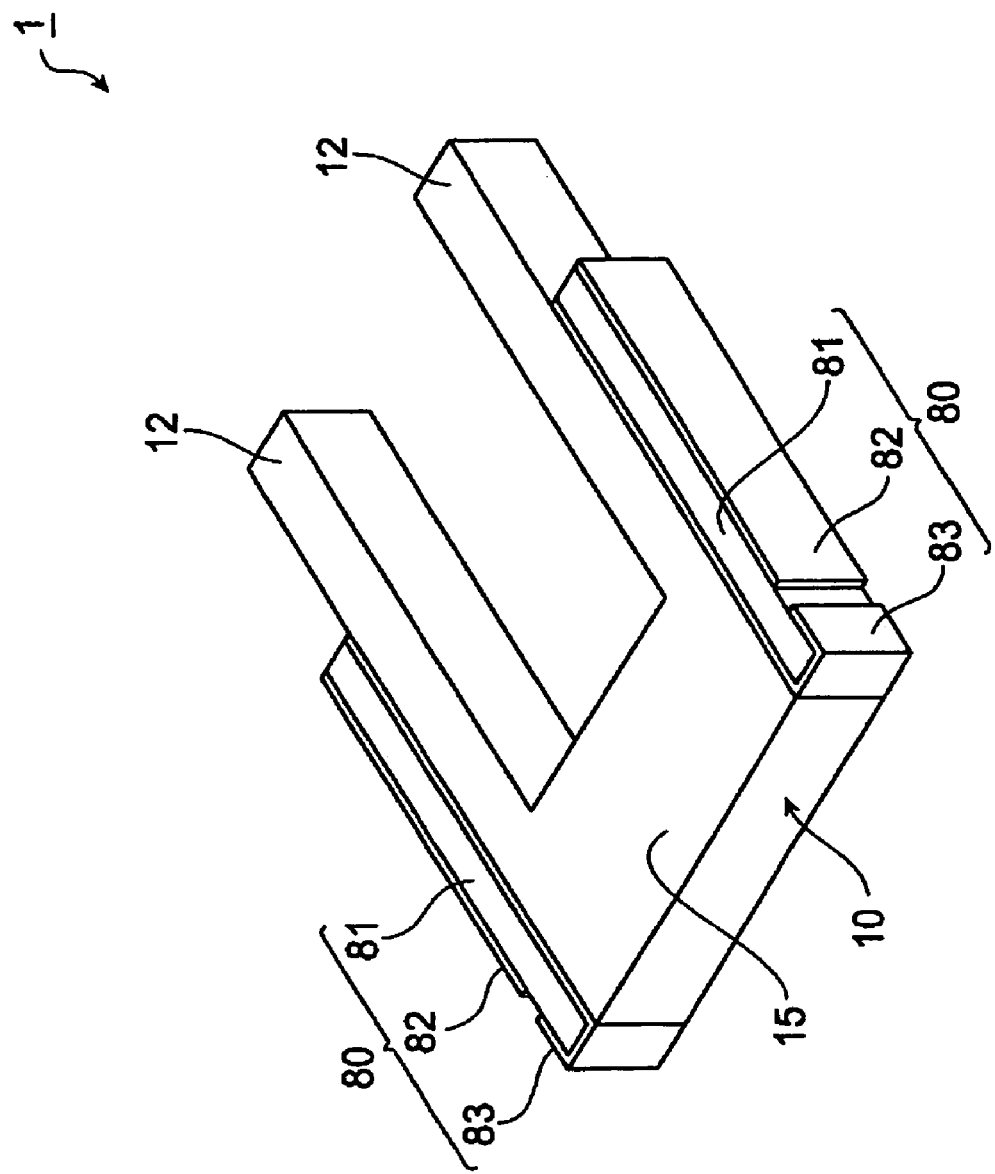
FIG. 7 is a perspective view showing the actuator in accordance with a fourth embodiment of the present invention.

Fourth Embodiment: FIG. 7 is a perspective view showing a fourth embodiment of the actuator in accordance with the present invention. The actuator 1 in accordance with this embodiment differs from that of the first embodiment in the piezoelectric device structure. Namely, though each piezoelectric ceramic body 81 has a single-plate structure as in the first embodiment, configurations of electrodes 82, 83 differ from those in the first embodiment. The electrode 83 covers the surface on the silicon structure 10 side, a side end face, and a part of the outer side face of the piezoelectric ceramic body 81. On the other hand, the electrode 82 is formed on the outer side face of the ceramic body 81 while being separated by a predetermined gap from the electrode 83. Such a configuration is advantageous in that wiring operations such as wire bonding can be carried out on the same surface.

In this embodiment, the silicon structure 10 may be caused to attain a low resistance by doping with impurities, or a high resistance without doping. This embodiment is advantageous in that the making is easier than in the first embodiment, since the time and effort of doping with impurities can be saved.

While the invention achieved by the inventors are specifically explained in the foregoing with reference to the embodiments, the present invention is not limited to the above-mentioned embodiments. For example, though piezoelectric devices are exemplified by those of single-plate and laminated types, those of bimorph type may also be used.

As explained in the foregoing, the present invention can control arms with high precision, achieve smaller sizes, and facilitate the making.

The basic Japanese Application No. 2002-345815 filed on Nov. 28, 2002 is hereby incorporated by reference.

What is claimed is:

1. A head actuator comprising:
    a silicon structure, integrally formed from single-crystal silicon, having only two arms and a connecting part for connecting the arms to each other; and
    respective piezoelectric devices attached to the arms.

2. The head actuator according to claim 1, wherein each piezoelectric device has a form extending in one direction;
    each piezoelectric device being attached to an outer side face of the respective arm such that a longitudinal direction of the piezoelectric device extends along a longitudinal direction of the arm.

3. The head actuator according to claim 1, wherein the piezoelectric devices are laminated multilayer piezoelectric devices.

4. The head actuator according to claim 1, wherein the silicon structure is doped with an impurity so as to yield a lower resistance.

5. A method of making an actuator, the method comprising the steps of:
    etching one surface of a single-crystal silicon substrate so as to form a plurality of plate-like projections arranged in parallel on the single-crystal silicon substrate;
    cutting the single-crystal silicon substrate into a plurality of blocks each having a pair of plate-like projections;
    attaching an elongated piezoelectric device body to an outer side face of each of a pair of plate-like projections in each block; and
    cutting the block having the elongated piezoelectric devices attached thereto into a plurality of actuators each comprising a silicon structure integrally formed with a pair of arms and a connecting part for connecting the arms to each other, and respective piezoelectric devices attached to the arms.

* * * * *